United States Patent
Laboutin et al.

(10) Patent No.: US 9,076,812 B2
(45) Date of Patent: Jul. 7, 2015

(54) HEMT STRUCTURE WITH IRON-DOPING-STOP COMPONENT AND METHODS OF FORMING

(71) Applicant: IQE KC, LLC, Taunton, MA (US)

(72) Inventors: Oleg Laboutin, South Easton, MA (US); Yu Cao, Norwood, MA (US); Wayne Johnson, Easton, MA (US)

(73) Assignee: IQE KC, LLC, Taunton, MA (US)

( * ) Notice: Subject to any disclaimer, the term of this patent is extended or adjusted under 35 U.S.C. 154(b) by 0 days.

(21) Appl. No.: 13/929,161

(22) Filed: Jun. 27, 2013

(65) Prior Publication Data

US 2015/0001582 A1 Jan. 1, 2015

(51) Int. Cl.
  *H01L 29/778* (2006.01)
  *H01L 29/66* (2006.01)
  *H01L 29/36* (2006.01)
  *H01L 29/207* (2006.01)
  *H01L 29/20* (2006.01)

(52) U.S. Cl.
  CPC .......... *H01L 29/66462* (2013.01); *H01L 29/36* (2013.01); *H01L 29/7786* (2013.01); *H01L 29/2003* (2013.01); *H01L 29/207* (2013.01)

(58) Field of Classification Search
  CPC ................. H01L 29/7783; H01I 29/66462
  USPC .......................................... 257/194; 438/172
  See application file for complete search history.

(56) References Cited

U.S. PATENT DOCUMENTS

| 6,177,685 | B1 | 1/2001 | Teraguchi et al. |
| 8,198,652 | B2 | 6/2012 | Ando et al. |
| 2006/0054929 | A1 | 3/2006 | Nakayama et al. |
| 2007/0164322 | A1 | 7/2007 | Smith et al. |
| 2010/0117118 | A1* | 5/2010 | Dabiran et al. ............... 257/190 |
| 2013/0161698 | A1 | 6/2013 | Marino et al. |
| 2013/0181224 | A1 | 7/2013 | Lim et al. |
| 2014/0151712 | A1 | 6/2014 | Cao et al. |
| 2014/0167058 | A1 | 6/2014 | Cao et al. |
| 2014/0175519 | A1 | 6/2014 | Rehder et al. |

FOREIGN PATENT DOCUMENTS

JP     2006-237281 A     9/2006

OTHER PUBLICATIONS

Balmer, R.S., et al., "On the Incorporation Mechanism of Fe in GaN Grown by Metal-Organic Vapour Phase Epitaxy," *phys. stat. sol.* 3(6):1429-1434 (2006).

(Continued)

*Primary Examiner* — Roy Potter
*Assistant Examiner* — Paul Patton
(74) *Attorney, Agent, or Firm* — Hamilton, Brook, Smith & Reynolds, P.C.

(57) ABSTRACT

An iron-doped high-electron-mobility transistor (HEMT) structure includes a substrate, a nucleation layer over the substrate, and a buffer layer over the nucleation layer. The gallium-nitride buffer layer includes a iron-doping-stop layer having a concentration of iron that drops from a juncture with an iron-doped component of the buffer layer over a thickness that is relatively small compared to that of the iron-doped component. The iron-doping-stop layer is formed at lower temperature compared to the temperature at which the iron-doped component is formed. The iron-doped HEMT structure also includes a channel layer over the buffer layer. A carrier-supplying barrier layer is formed over the channel layer.

34 Claims, 4 Drawing Sheets

(56) References Cited

OTHER PUBLICATIONS

Desmaris, V., et al., "Comparison of the DC and Microwave Performance of AlGaN/GaN HEMTs Grown on SiC by MOCVD With Fe-Doped or Unintentionally Doped GaN Buffer Layers," *IEEE Transactions on Electron Devices* 53(9):2413-2417 (2006).

Heikman, S., et al., "Growth of Fe Doped Semi-Insulating GaN by Metalorganic Chemical Vapor Deposition," *Applied Physics Letters* 81(3):439-441 (2002).

Rudzinski, M., et al., "Growth of Fe Doped Semi-Insulating GaN on Sapphire and 4H—SiC by MOCVD," *phys. stat. sol.* 3(6):2231-2236 (2006).

Final Office Action dated May 13, 2014 for U.S. Appl. No. 13/528,937, filed Jun. 21, 2012, Entitled: "Bipolar High Electron Mobility Transistor and Methods of Forming Same".

Office Action dated Aug. 15, 2014 for U.S. Appl. No. 13/912,834, filed Jun. 7, 2013, entitled: "Enhancement-Mode High Electron Mobility Transistor Structure and Method of Making Same".

International Preliminary Report on Patentability from PCT/US2013/022137, entitled "III-N-Based Double Heterostructure Field Effect Transistor and Method of Forming the Same", Dated: Jul. 22, 2014.

Lee, D. S., et al., "Impact of GaN Channel Scaling in InAlN/GaN HEMTs." Paper presented at Electron Devices Meeting (IEDM): pp. 19.2.1-19.2.4, (2011).

Lee, K. H., et al., "AlGaN/GaN high electron mobility transistors based on InGaN/GaN multiquantum-well structures," Applied Physics Letters, 96: 212105, 3 pages, (2010).

Kuzmik, J., and Georgakilas, A., "Proposal of High-Electron Mobility Transistors With Strained InN Channel," IEEE Transactions on Electron Devices, 58(3): 720-724, (2011).

* cited by examiner

HEMT STRUCTURE WITH IRON-DOPING-STOP COMPONENT AND METHODS OF FORMING

BACKGROUND OF THE INVENTION

III-nitride semiconductors are very promising materials for use in high-electron mobility transistor (HEMT) structures, which typically include a carrier-supplying layer and a channel layer supporting the carrier-supplying layer. A semi-insulating buffer layer generally is required for electrical insulation of the HEMT structure from a substrate, and to provide tight charge control of the HEMT channel layer of the HEMT structure. Often, two types of gallium nitride (GaN) buffer layers are employed as the buffer layer: the first being a nominally-undoped GaN layer adjacent to the channel layer where intrinsic defects, such as dislocations and carbon impurity render semi-insulating properties; and the second being a GaN layer relatively remote from the channel layer that is intentionally doped with iron (Fe). The iron-doped buffer layer effectively isolates the HEMT structure from the underlying substrate by trapping free electrons in iron-impurity-related centers within the crystal structure.

The effectiveness of intentionally-doped buffer layers is often limited by the limited ability to control the concentration of doping during fabrication of the buffer layer. In particular, the profile of iron doping across an intentionally-doped buffer layer exhibits severe delay and a slow rise in the concentration of the iron upon introduction of iron during deposition of the layer and also very slow decay in the concentration of iron after terminating introduction of iron to the vapor from which the buffer layer is deposited. For example, as demonstrated by Rudzinski et al., Phys. Stat. Sol. (c) 3, 6, 2231-2236 (2006), after the introduction of iron to a gaseous phase above a buffer layer has terminated, the concentration of iron over a large thickness of GaN (e.g. 1 µm or larger) decreases very slowly. This slow diminishment in iron concentration has been attributed to segregation of iron on the surface of GaN as it forms (Heikman et al., App. Phys. Lett. 81, 439 (2002)). Moreover, if decay in iron concentration of a nominally-undoped buffer layer is not complete, iron can become incorporated into the overlying channel layer, thereby degrading performance characteristics of the resulting HEMT structure, as demonstrated by Desmaris et al. IEEE Trans. Electron Devices 52, 9, 2413-2417, (2006).

One attempt to solve the problem of iron contamination of the HEMT channel layer is to concentrate iron at a portion of the buffer layer that is relatively close to the substrate, and to leave the portion of the buffer layer relatively close to the channel layer essentially undoped. As a consequence, the GaN buffer layer has a concentration of iron doping that is modulated across the thickness of the buffer layer, whereby the highest concentrations of iron doping are relatively remote from the overlying channel layer. One limitation that is commonly associated with such modulated iron-doping is that the resulting HEMT structure is vulnerable to excessive leakage and poor device pinch-off due to undesirable electron conduction in the relatively undoped part of the GaN buffer layer.

Therefore, a need exists for a gallium nitride-based HEMT structure within an iron-doped buffer layer, and for methods of forming such structures, that overcome or minimize the above-referenced problems.

SUMMARY OF THE INVENTION

The invention generally is directed to an iron-doped high electron-mobility transistor (HEMT) structure that includes a buffer layer having doped buffer layer component and an iron-doping-stop layer adjoining the doped buffer layer that has an iron concentration that drops precipitously over an average thickness in a range of between about 1 nm and about 100 nm, and to a method of forming the iron-doped high electron-mobility transistor structure of the invention.

In one embodiment, the iron-doped high electron-mobility transistor structure includes a substrate, a nucleation layer over the substrate, and a buffer layer over the nucleation layer. The buffer layer includes an iron-doped layer over the nucleation layer. Preferably, the iron-doped layer is doped with iron at a level that is essentially constant from the nucleation layer to an iron-doping-stop layer, over an average thickness of at least about one micrometer (µm). A nominally-undoped iron-doping-stop layer adjoins the iron-doped layer, and has an iron concentration that depends on the iron concentration in the iron doped layer. The iron concentration in the iron-doping stop layer equals or is higher than that in the iron-doped layer. A channel layer is over the buffer layer, and a carrier-supplying barrier layer is grown over the channel layer.

In one embodiment of the method of the invention, an iron-doped high electron-mobility transistor structure of the invention is formed by forming a nucleation layer over a substrate, and growing a buffer layer over the nucleation layer, wherein the method of forming the buffer layer over the nucleation layer includes the steps of: i) directing essentially constant flows of the nitrogen, gallium and iron sources into a growth chamber at a temperature in a range of between about 900° C. and about 1100° C., to thereby form an iron-doped GaN layer over the nucleation layer until the iron-doped GaN layer has a thickness in a range of between about 0.3 µm and about 10 µm, and preferably about 1-2 µm; ii) terminating growth of the iron-doped GaN layer by terminating the flow of the gallium and iron sources into the growth chamber; and iii) reducing the growth temperature to a temperature in a range of between about 500° C. and about 900° C., thereby terminating formation of the iron-doped GaN layer; iv) forming an iron-doping stop layer by re-introducing gallium source flow into the growth chamber; v) increasing the growth temperature to a temperature in a range of between about 900° C. and about 1100° C. Thereafter, a nominally-undoped channel layer is grown over the buffer layer, and a carrier layer is grown over the channel layer.

This invention has many advantages. For example, the inventors have discovered that, by lowering the growth temperature of a buffer layer from a temperature in a range of between about 900° C. and about 1100° C. to a temperature in a range of between about 500° C. and about 900° C., the consequent low-growth temperature reduces mobility of the iron atoms floating on the surface of gallium nitride being deposited and, consequently, forces them to become incorporated into the iron-doping stop layer being deposited. Without being limited to any particular theory, it is believed that, if sufficiently thick, the iron-doping stop layer grown at low temperature will consume all of the iron atoms floating on the surface of the iron-doped gallium nitride buffer layer and stop iron from being incorporated into a subsequently grown channel layer of the HEMT structure. As a result, the contamination of the channel layer by iron is substantially reduced or eliminated, thereby minimizing or eliminating any degradation of the HEMT characteristics. In addition, a reduction in temperature during deposition of the iron-doping stop layer enables fabrication of an iron-doped buffer layer adjacent to the channel layer and thus minimizing leakage and poor device pinch-off due to undesirable electron conduction below the channel layer.

DETAILED DESCRIPTION OF THE INVENTION

The invention is directed to an iron-doped high electron-mobility transistor (HEMT) structure that includes a GaN buffer layer that includes an iron-doping-stop layer, and to a method of forming the HEMT structure of the invention.

Figure 1:
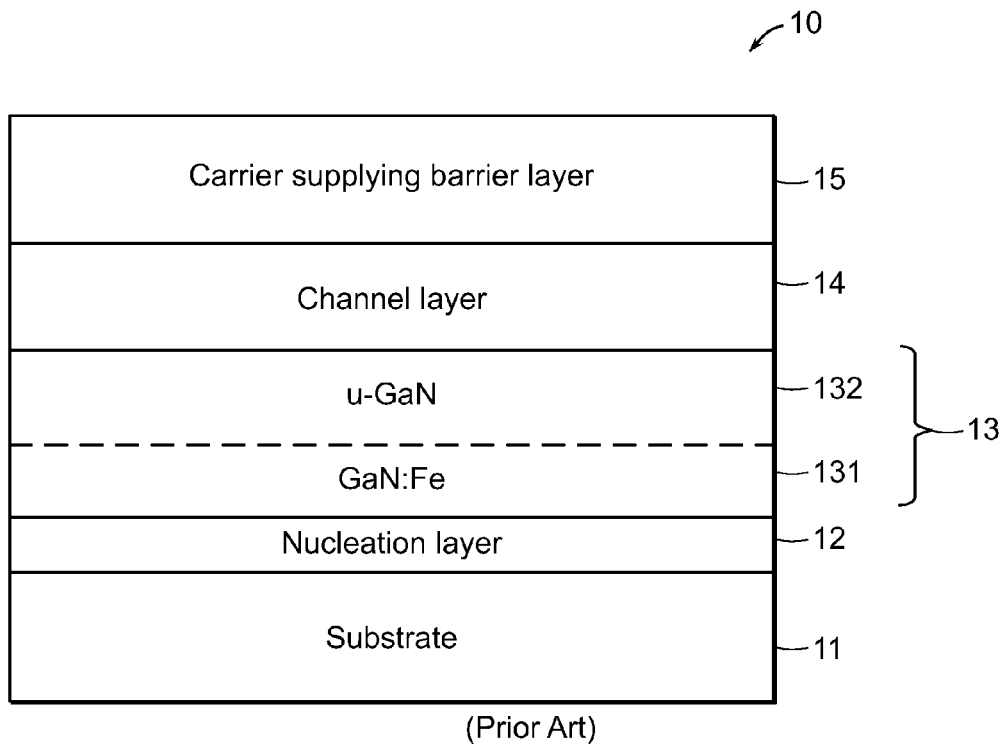
FIG. 1 is a schematic representation of a prior art GaN-based HEMT structure having modulated iron doping in the iron-doped GaN buffer layer.

One embodiment of a prior art high electron-mobility transistor (HEMT) structure is shown in FIG. 1. As represented therein, prior art HEMT structure 10 includes modulated (MD) Fe-doped gallium nitride (GaN) buffer layer 131. HEMT structure 10 includes substrate 11, nucleation layer 12 grown over substrate 11, GaN buffer layer 13 grown over nucleation layer 12 opposite substrate 11, gallium nitride (GaN) channel layer 14 grown over GaN buffer layer 13 opposite nucleation layer 12, and carrier-supplying layer 15 grown over channel layer 14 opposite GaN buffer layer 13. GaN buffer layer 13 includes lower component 131 adjacent to nucleation layer 12 where, during formation, GaN that is deposited on layer 12 is doped with iron (Fe). Upper component 132 of GaN buffer layer 13 is adjacent to channel layer 14 and is nominally undoped (i.e., no iron source is intentionally introduced into the growth chamber during fabrication of this layer.). However, typically a significant amount of iron is incorporated unintentionally into upper component 132 of GaN buffer layer 13 by virtue of surface segregation of the iron atoms on the surface of Fe-doped component 131. (See, for example, Balmer, et al., Phys. Stat. Sol. (c), 3, 6, 1429-1434 (2006), the relevant teachings of which are incorporated herein by reference in their entirety.)

Figure 2:
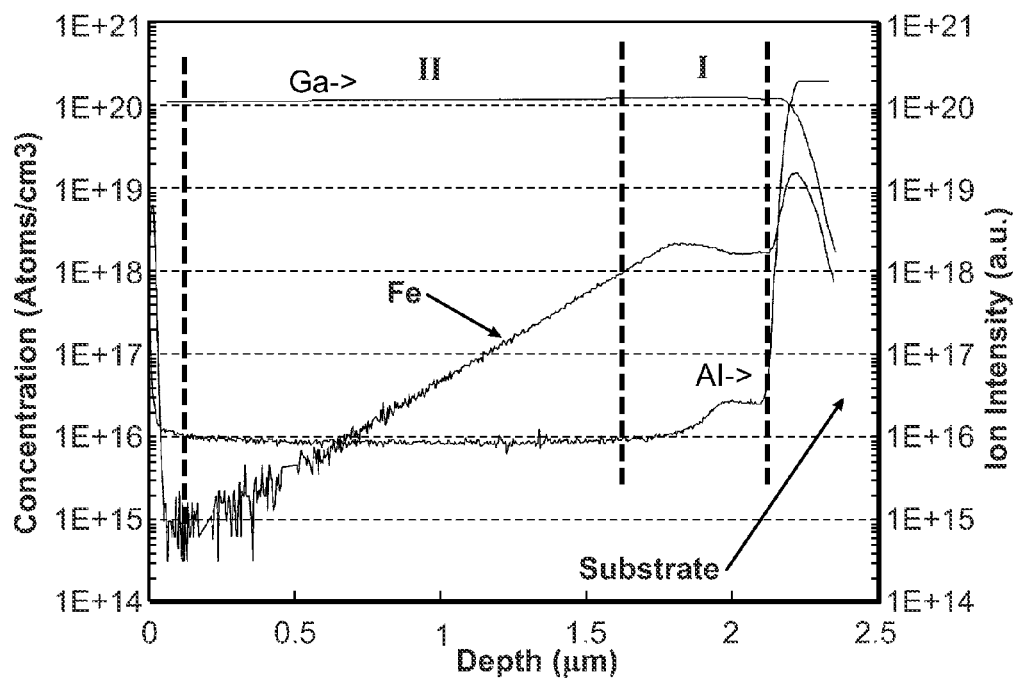
FIG. 2 is a plot of a typical iron concentration depth profile in the iron-doped GaN buffer layer of FIG. 1 (PRIOR ART).

The iron concentration in Fe-doped component 131 of GaN buffer layer 13 typically is in a range of between about $1\times10^{17}$ cm$^{-3}$ and about $1\times10^{20}$ cm$^{-3}$. The thickness of Fe-doped component 131 typically is in a range of between about 0.3 μm, and about 10 μm. A depth profile of iron concentration in GaN buffer layer 13 along a direction from carrier-supplying barrier layer 15 to substrate 11 is shown in FIG. 2 and represents a depth profile measured by the second ion mass spectroscopy (SIMS) analysis. As can be seen from FIG. 2, iron concentration in the buffer layer is relatively high in Region I, near substrate 11, and gradually decreases in Region II of the buffer layer toward channel layer 14 of HEMT structure 10.

Figure 3:
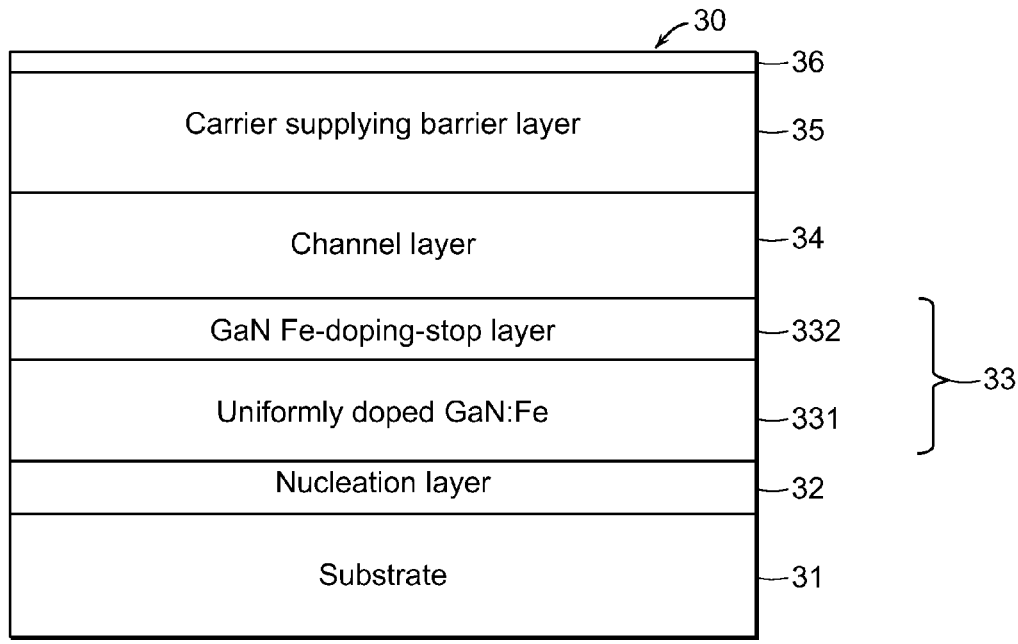
FIG. 3 is a schematic representation of an iron-doped HEMT structure of the invention having a buffer layer with an iron-doped layer and an iron-doping-stop layer.

FIG. 3 is a schematic representation of an iron-doped high electron mobility transistor (HEMT) structure of the invention. As represented therein, HEMT structure 30 includes substrate 31, nucleation layer 32 grown over substrate 31, Fe-doped composite GaN buffer layer 33 grown over nucleation layer 32 opposite substrate 31, channel layer 34 grown over buffer layer 33 opposite nucleation layer 32 and carrier-supplying barrier layer 35 grown over channel layer 34 opposite buffer layer 33.

Figure 4:
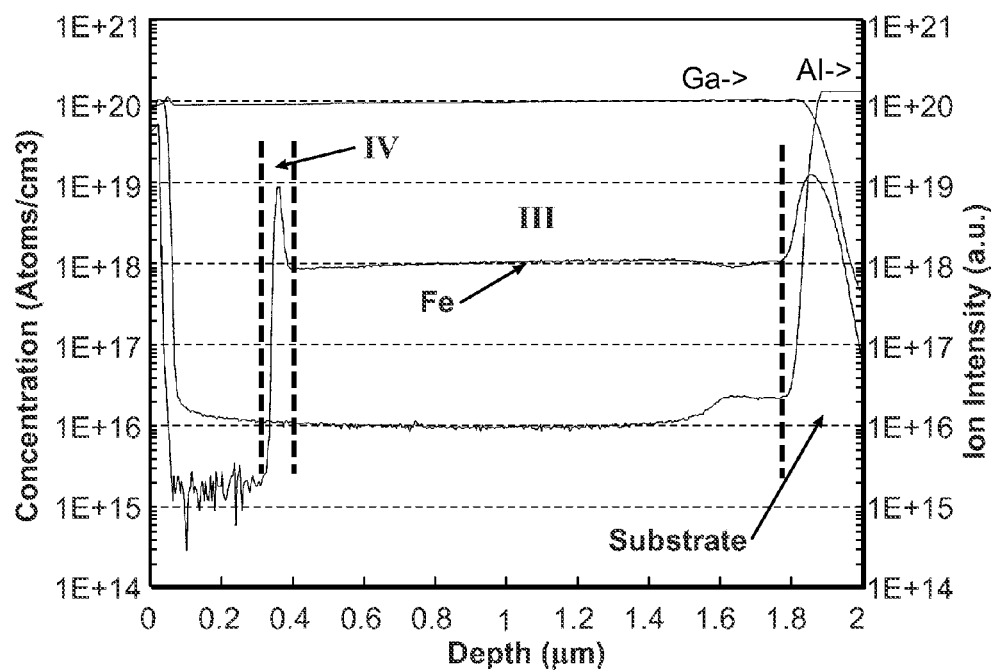
FIG. 4 is a plot of typical iron-concentration depth profile in the iron-doped HEMT structure of the invention shown in FIG. 3.

Buffer layer 33 includes iron-doped layer 331 and iron-doping-stop layer 332. Preferably, iron-doped layer 331 includes at least one member of the group consisting of GaN, AlN and AlGaN. More preferably, iron-doped layer consists essentially of GaN. The phrase "consists essentially of" herein means that, other than possible doping, such as iron-doping, the material includes no other materials that significantly affect the function of the material as a component of a HEMT structure. In one embodiment, the iron concentration in iron-doped layer 331 typically is in a range of between about $5\times10^{16}$ cm$^{-3}$, and about $1\times10^{20}$ cm$^{-3}$. In a preferred embodiment, the concentration of iron in iron-doped layer 331 is in a range of between about $1\times10^{18}$ cm$^{-3}$ and about $5\times10^{18}$ cm$^{-3}$. In a most preferred embodiment, the concentration of iron is essentially constant along a direction from nucleation layer 32 to doping-stop layer 332. The concentration of iron in buffer layer 331 should be sufficient to trap essentially all free carriers in the GaN structure of iron-doped layer 331. The thickness of buffer layer component 331 typically is in a range of between about 0.3 μm and about 20 μm, and preferably in a range of about 1 μm and about 3 μm. Iron-doping-stop layer 332 is formed of the same nitride material as that of iron-doped layer 331, and has a concentration of iron doping that drops from a juncture where iron-doping-stop layer adjoins iron-doped layer 331, to a surface distal to the juncture with iron-doped layer 331, over a thickness of iron-doping stop layer 332 in a range of between about 1 nm and about 100 nm; and preferably between about 5 nm and about 20 nm. Iron-doping in iron-doping-stop layer can spike between the juncture and the distal surface. The concentration of iron at the juncture with iron-doped layer 331 typically is the same as that in the iron-doped layer, and at the distal surface typically is below $1\times10^{16}$ cm$^{-3}$. The concentration of iron-doping at the distal surface is typically sufficiently low to minimize leakage and poor device pinch off due to undesirable electron conduction underneath the channel layer 34. An iron-concentration depth profile of HEMT 30 of the invention shown in FIG. 3 is illustrated in FIG. 4. The depth profile represented in FIG. 4 is obtained using SIMS analysis. As shown in FIG. 4, for example, the iron concentration is about $1.2\times10^{18}$ in iron-doped layer 331 ("Region III"). Iron concentration spikes to about $7\times10^{18}$ cm$^{-3}$ and falls below $1\times10^{16}$ cm$^{-3}$ in iron-doping-stop layer 332 ("Region IV"). It is to be noted that the iron concentration of about $1\times10^{16}$ cm$^{-3}$ is near a SIMS detection limit.

Examples of suitable substrates of HEMT structure 30 of the invention can be any suitable substrate for a HEMT structure, as is known in the art, such as aluminum nitride (AlN), gallium nitride (GaN), sapphire ($Al_2O_3$), silicon (Si), or silicon carbide (SiC). As is known in the art, a suitable nucleation layer of HEMT structure 30 will depend upon the substrate employed, but can be, for example, gallium nitride (GaN), aluminum nitride (AlN), aluminum gallium nitride (AlGaN), or a multiple-layer structure formed employing these materials.

Channel layer 34 of HEMT structure 30 of the invention can be formed of a suitable material for forming channel layers of HEMT structures, as is known in the art, such as, for example, gallium nitride (GaN), aluminum gallium nitride (AlGaN), indium nitride (InN), or gallium indium nitride (GaInN). The thickness of channel near 34 is a suitable thickness for HEMT structures known in the art and, for example, can be in the range of between about 5 nm and about 800 nm.

Preferably, the thickness of channel layer 34 is in range of between about 10 nm and about 100 nm.

Suitable materials of construction of carrier-supplying barrier layer 35 of HEMT structure 30 of the invention can be any suitable material known in the art of carrier-supplying barrier layers of HEMT structures and can be, for example, aluminum nitride (AlN), gallium nitride (GaN) or aluminum gallium indium nitride (AlGaInN) alloy. Further, the band-gap of the material employed in carrier-supply barrier layer 35 of HEMT structure 30 is wider than that in channel layer 30, and the difference in internal polarization charges between carrier-supplying barrier layer 35 and channel layer 34 is such that a 2-dimensional electron gas is formed in channel layer 34 of HEMT structure 30. Typically, the thickness of carrier-supplying barrier layer 35 is in a range of between about 2 nm and about 100 nm and, preferably, between about 3 nm and about 30 nm. In some embodiments, a contact layer 36, consisting, for example, essentially of aluminum nitride (AlN), gallium nitride (GaN), indium nitride (InN) or aluminum gallium indium nitride (AlGaInN) alloy can be formed over carrier-supply barrier layer 35 of HEMT structure 30 of the invention.

A layer that is "directly on" another layer or substrate means that no intervening layer is present. It should also be understood that when a layer is referred to as being "on" or "over" another layer or substrate, it may cover the entire layer or substrate, or a portion of the layer or substrate.

In a method for forming an HEMT structure of the invention, substrate 31' nucleation layer 32, channel layer 34, carrier-supplying barrier layer 35, and optional contact layer 36 are formed by methods known in the art of preparing HEMT structures.

Figure 5:
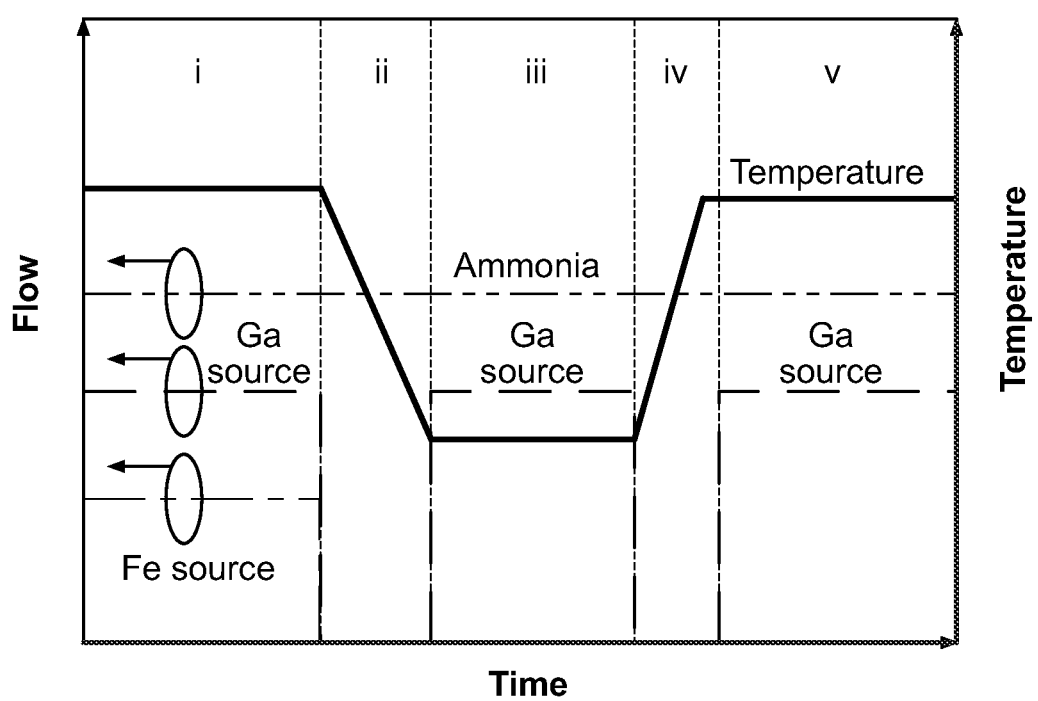
FIG. 5 is a diagram illustrating a growth procedure for the iron-doping stop layer component of the invention.

In one embodiment, of HEMT structure 30 of the invention is formed by metal-organic chemical vapor deposition ("MOCVD"). In this embodiment, a growth temperature for forming iron-doped layer 331 is measured by use of a pyrometer on a surface of a wafer carrier that is at a temperature in a range of between about 900° C. and about 1100° C., and preferably at a temperature of about 1000° C., which is typical for MOCVD of gallium nitride. One embodiment of an MOCVD growth procedure of formation of iron-doping-stop layer 332 is illustrated in FIG. 5. After formation of nucleation layer 32, iron-doped layer 331 (region i) is formed by directing nitrogen, gallium and iron sources into a growth chamber at an appropriate temperature, such as is known in the art. Examples of suitable sources of nitrogen, gallium and iron are such as are known to those of skill in the art, such as ammonia, trimethylgallium and ferrocene. The nitrogen, gallium and iron sources are directed into the growth chamber at appropriate rates to grow iron-doped layer 331 having a desired iron-doping profile, such as an essentially constant concentration of iron from nucleation layer 32 to a distal junction of iron-doped layer 331 with subsequently-formed iron-doping-stop layer 332. An example of a preferred iron-doping profile is shown in FIG. 4.

To terminate growth of iron-doped layer 331, flow of gallium and iron sources into the growth chamber is terminated (e.g., by stopping flow of gallium and iron sources) while maintaining flow of the nitrogen source into the growth chamber. In addition and, generally, simultaneously with terminating flow of gallium and iron sources, the temperature of the wafer carrier is reduced from a temperature of about 1000° C. to a temperature in a range of between about 500° C. and about 900° C. (region ii) and, preferably, to a temperature in a range of between about 750° C. and about 850° C. Most preferably, the temperature to which the surface of the supporting wafer carrier is reduced is about 800° C. Growth of iron-doping stop layer 332 is started at the lower temperature (e.g., 800° C.), by reintroducing flow of the gallium source into the growth chamber (region iii of FIG. 5). When iron-doping stop layer 332 is at an appropriate thickness, such as a thickness in a range of between about 1 nm and 100 nm, growth is stopped by terminating the gallium source flow into the growth chamber and the temperature of the wafer carrier, as measured by a pyrometer, is increased from about 800° C. back to about 1,000° C. (region iv of FIG. 5.). Growth of nominally-undoped channel layer 34 is started at about 1,000° C. by reintroducing gallium source flow in the growth chamber (region v. in FIG. 5.).

Although not wishing to be limited to any particular theory, it is believed that the relatively low growth temperature employed to form iron-doping-stop layer 332 reduces mobility of iron atoms floating on the surface of iron-doped layer and, thus, forces the iron atoms to be incorporated into iron-doping-stop layer 332. If grown sufficiently thick, iron-doping-stop layer 332 consumes all of the iron atoms floating on the surface and stops the iron from being incorporated into subsequently-grown channel layer 34. In spite of the absence of intentional doping in iron-doping-stop layer 332, the iron concentration in this layer can sharply increase above the doping level in iron-doped layer 331 and then sharply decrease to a background, nominally-undoped, or nonexistent iron concentration level.

The following is a non-limiting example of one embodiment of the invention.

EXEMPLICATION

Figure 6A:
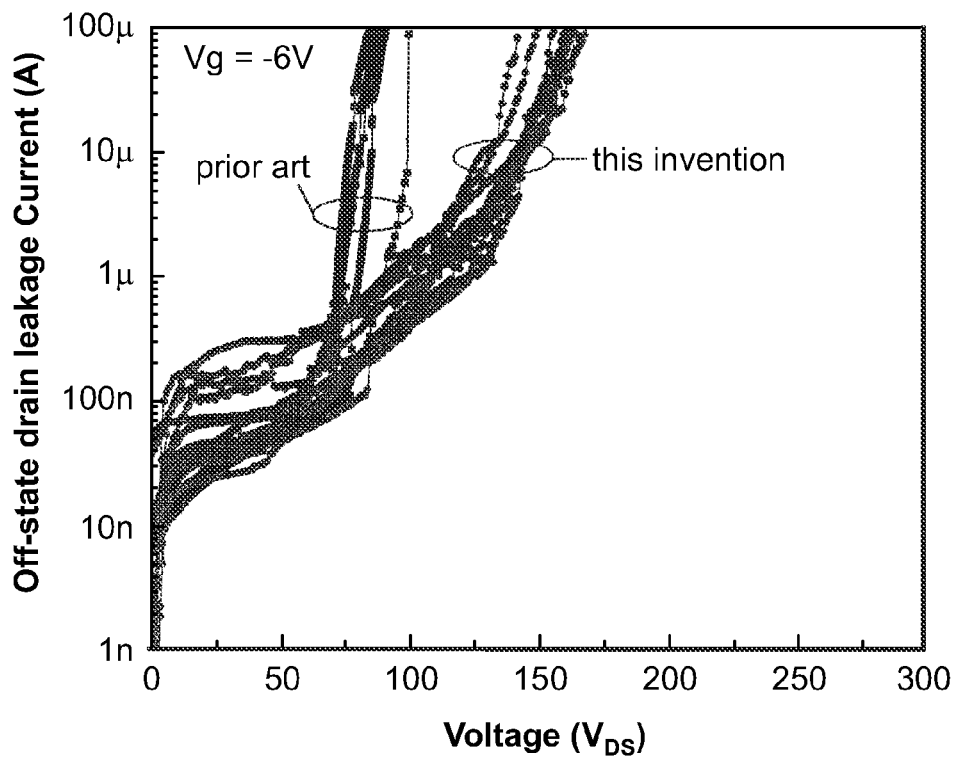
FIG. 6 is a plot of the off-state (a) and isolation (b) characteristics of a prior art and of a HEMT according to this invention.
Figure 6B:
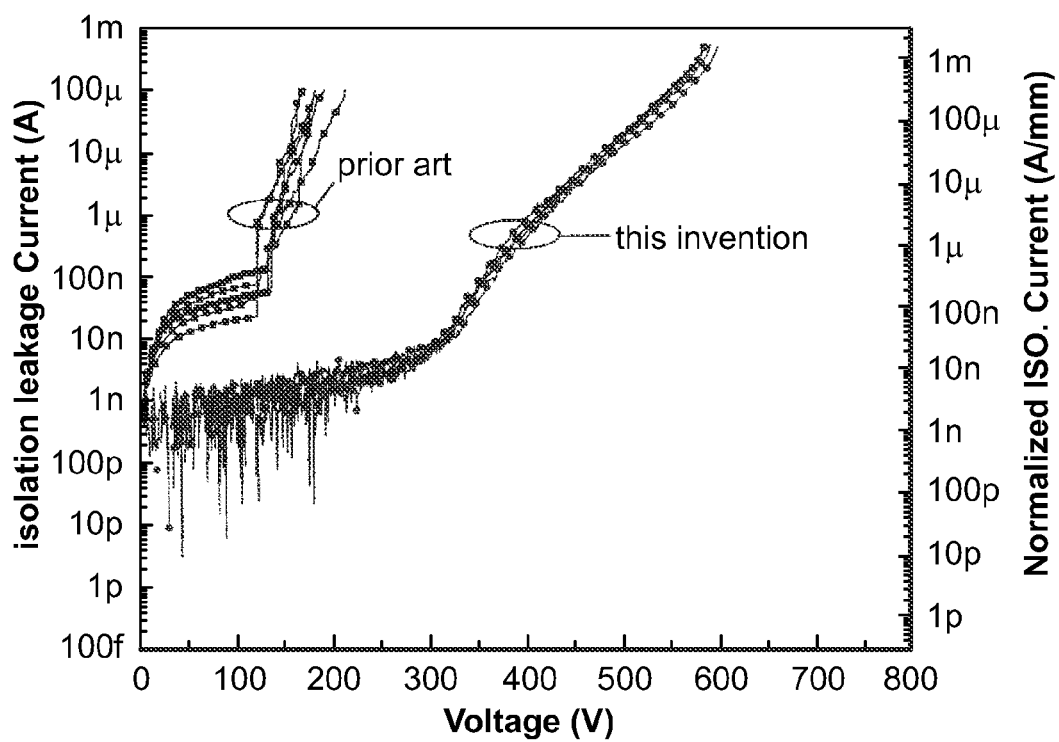

FIG. 6 illustrates a working example of the HEMT structure using the uniformly Fe-doped composite GaN buffer according to this invention in comparison with the prior art HEMT structure using modulated Fe-doped GaN buffer. A simple HEMT device was fabricated on each structure through the steps of:

a. Lithography and evaporation to form ohmic contacts of Ti/Al/Ni/Au.
b. Rapid thermal annealing of the ohmic contacts to ~850 degrees C. for ~30 seconds in flowing nitrogen.
c. Nitrogen ion implantation to a vacancy concentration of ~1 E20 $cm^{-3}$ to a depth of ~0.5 μm for inter-device isolation.
d. Lithography and evaporation to form Schottky contacts of Ni/Au.

Gate length, gate-source spacing, and gate-drain spacing were 2 μm, 2 μm, and 2 μm. Devices were characterized for 3-terminal off-state leakage characteristics by grounding the source contact, fixing the gate contact at −6V, and sweeping the drain-source voltage as shown in FIG. 6(a). Isolation leakage characteristics were measured using 2 ohmic contacts separated by a 5 μm implanted region. One of the contacts was grounded and bias to the other contact was swept as shown in FIG. 6(b.) One can clearly see in FIG. 6 that the HEMT according to this invention exhibited lower leakage and isolations currents when compared to the prior art HEMT.

EQUIVALENTS

While this invention has been particularly shown and described with references to example embodiments thereof, it will be understood by those skilled in the art that various changes in form and details may be made therein without departing from the scope of the invention encompassed by the appended claims.

The teachings of all patents, published applications and references cited herein are incorporated by reference in their entirety.

What is claimed is:

1. An iron-doped high electron-mobility transistor structure, comprising:
   a) a substrate;
   b) a nucleation layer over the substrate;
   c) a buffer layer over the nucleation layer, said buffer layer including,
      i) an iron-doped layer over the nucleation layer;
      ii) an iron-doping-stop layer adjoining the iron-doped layer at a juncture, the iron-doping-stop layer having an iron concentration below about $1\times10^{16}$ cm$^{-3}$ at a surface distal to the juncture with the iron-doped layer, and wherein the iron-doping stop layer has an average thickness in a range of between about 1 nm and about 100 nm
   d) a channel layer over the buffer layer; and
   e) a carrier-supplying barrier layer over the channel layer.

2. The iron-doped high electron mobility transistor structure of claim 1, wherein the iron-doping layer has a thickness in a range of between about 5 nm and about 20 nm.

3. The iron-doped high electron-mobility transistor structure of claim 1, wherein the concentration of iron is essentially constant from the nucleation layer to the iron-doping-stop layer.

4. The iron-doped high electron mobility transistor structure of claim 3, wherein the iron-doped layer of the buffer layer has an average thickness in a range of between about 0.5 and about 20 μm.

5. The high electron-mobility transistor structure of claim 4, wherein the iron concentration of the doped layer is in a range of between about $5\times10^{16}$ cm$^{-3}$ and about $1\times10^{20}$ cm$^{-3}$.

6. The iron-doped high electron-mobility transistor structure of claim 5, wherein the iron concentration of the doped layer is in a range of between about $1\times10^{18}$ cm$^{-3}$ and about $5\times10^{18}$ cm$^{-3}$.

7. The iron-doped high electron-mobility transistor structure of claim 1, wherein the buffer layer includes at least one member selected from the group consisting of GaN, AlN and AlGaN.

8. The iron-doped high electron-mobility transistor structure of claim 7, wherein the buffer layer has a thickness in a range of between about 0.5 μm and about 20 μm.

9. The iron-doped high electron-mobility transistor structure of claim 8, wherein the buffer layer has a thickness in a range of between about 1 μm and about 5 μm.

10. The iron-doped high electron-mobility transistor structure of claim 1, wherein the substrate consists essentially of at least one member of the group consisting of AlN, GaN, Al$_2$O$_3$, SiC and Si.

11. The iron-doped high electron-mobility transistor structure of claim 1, wherein the nucleation layer includes at least one member selected from the group consisting of GaN, AlN, and AlGaN.

12. The iron-doped high electron-mobility transistor structure of claim 1, wherein the nominally-undoped channel layer consists essentially of at least one member selected from the group consisting of GaN, AlGaN, InN and GaInN.

13. The iron-doped high electron-mobility transistor structure of claim 12, wherein the channel layer has an iron concentration of less than about $1\times10^{16}$ cm$^{-3}$.

14. The iron-doped high electron-mobility transistor structure of claim 13, wherein the channel layer has an average thickness in a range of between about 5 nm and about 800 nm.

15. The iron-doped high electron-mobility transistor structure of claim 13, wherein the channel layer has a thickness in a range of between about 10 nm and about 100 nm.

16. The iron-doped high electron-mobility transistor structure of claim 1, wherein the carrier-supplying barrier layer consists essentially of at least one member selected from the group consisting of AlN, AlGaN and AlGaInN, and wherein the band-gap of the carrier-supplying barrier layer is greater than that of the channel layer, and the difference in the internal polarization charges between the carrier-supplying barrier layer and the channel layer results in formation of a two-dimensional electron gas in the channel layer.

17. The iron-doped high electron-mobility transistor structure of claim 16, wherein the carrier-supplying barrier layer has a thickness in a range of between about 2 nm and about 100 nm.

18. The iron-doped high electron-mobility transistor structure of claim 17, wherein the carrier-supplying barrier layer has a thickness in a range of between about 3 nm and about 30 nm.

19. The iron-doped high electron-mobility transistor structure of claim 1, further including a contact layer over the carrier-supplying barrier layer.

20. A MOCVD-based method of forming an iron-doped high electron-mobility transistor structure, comprising the steps of:
   a) forming a nucleation layer over a substrate;
   b) growing a buffer layer over the nucleation layer, the method of forming the buffer layer over the nucleation layer including the steps of,
      i) directing an essentially constant flow of a nitrogen source, an iron source and a gallium source to a growth surface within growth chamber to grow an iron-doped GaN layer at a temperature in a range of between about 900° C. and about 1100° C. over the nucleation layer until the iron-doped GaN layer has an average thickness in a range of between about 0.5 μm and about 20 μm,
      ii) terminating growth of the iron-doped GaN layer by terminating the flow of the gallium and iron sources and into the growth chamber,
      iii) reducing the temperature of the growth surface to a temperature in a range of between about 500° C. and about 900° C.;
      iv) forming an iron-doping stop layer by re-introducing flow of gallium source into the growth chamber, and
      v) increasing the temperature of the growth surface to a temperature of about 1000° C.;
   c) growing a channel layer over the buffer layer; and
   d) growing a carrier-supplying barrier layer over the channel layer.

21. The MOCVD method of claim 20, wherein the buffer layer includes at least one member of the group consisting of GaN, AlN and AlGaN.

22. The MOCVD method of claim 21, wherein the buffer layer has an average thickness in a range of between about 0.5 μm and about 20 μm.

23. The MOCVD method of claim 22, wherein the buffer layer has an average thickness in a range of between about 1 μm and about 5 μm.

24. The MOCVD method of claim 20, wherein the iron concentration of the doped layer is in a range of between about $5\times10^{16}$ cm$^{-3}$ and about $1\times10^{20}$ cm$^{-3}$.

25. The MOCVD method of claim 24, wherein the iron concentration of the doped layer is in a range of between about $1\times10^{18}$ cm$^{-3}$ and about $5\times10^{18}$ cm$^{-3}$.

26. The MOCVD method of claim 20, wherein the substrate consists of at least one member of the group consisting of GaN, AlN, $Al_2O_3$, SiC and Si.

27. The MOCVD method of claim 20, wherein the nucleation layer consists essentially of at least one member selected from the group consisting of GaN, AlN, and AlGaN.

28. The MOCVD method of claim 20, wherein the channel layer is at least one member selected from the group consisting of GaN, AlGaN, InN and GaInN.

29. The MOCVD method of claim 28, wherein the channel layer has an average thickness in a range of between about 5 nm and about 500 nm.

30. The MOCVD method of claim 29, wherein the channel layer has an average thickness in a range of between about 10 nm and about 30 nm.

31. The MOCVD method of claim 20, wherein the carrier-supplying barrier layer includes at least one member selected from the group consisting of AlN, AlGaN and AlGaInN, and wherein the band gap of the carrier-supplying barrier layer is greater than that of the channel layer, and the difference in the internal polarization charges between the carrier-supplying barrier layer and the channel layer causes formation of a two-dimensional electron gas in the channel layer.

32. The MOCVD method of claim 31, wherein the carrier-supplying barrier layer has an average thickness in a range of between about 2 nm and about 100 nm.

33. The MOCVD method of claim 32, wherein the carrier-supplying barrier layer has an average thickness in a range of between about 3 nm and about 30 nm.

34. The MOCVD method of claim 20, further including a contact layer over the carrier-supplying barrier layer.

\* \* \* \* \*